United States Patent [19]

Pribble et al.

[11] Patent Number: 5,404,109
[45] Date of Patent: Apr. 4, 1995

[54] METHOD AND APPARATUS FOR TESTING CIRCUITS CONTAINING ACTIVE DEVICES

[75] Inventors: William L. Pribble; Michael D. Pollman; Roger D. Sweeney, all of Roanoke, Va.

[73] Assignee: ITT Corporation, New York, N.Y.

[21] Appl. No.: 166,605

[22] Filed: Dec. 13, 1993

Related U.S. Application Data

[60] Division of Ser. No. 13,248, Feb. 3, 1993, abandoned, which is a continuation of Ser. No. 763,365, Sep. 20, 1991, abandoned.

[51] Int. Cl.[6] ............................................. G01R 27/00
[52] U.S. Cl. ..................................... 324/603; 324/768; 324/769; 324/619; 324/616; 330/2
[58] Field of Search ................. 330/1 R, 2; 324/603, 324/617, 618, 158 T, 158 D, 616, 619, 768, 769

[56] References Cited

U.S. PATENT DOCUMENTS

| | | | |
|---|---|---|---|
| 3,202,931 | 8/1965 | Koontz | 330/2 |
| 3,427,535 | 2/1969 | Welsh | 324/619 |
| 3,668,556 | 6/1971 | Harbeson | 330/2 |
| 3,870,953 | 3/1975 | Boatman | 324/158 T |
| 3,904,964 | 9/1975 | Mott | 324/619 |
| 4,039,945 | 8/1977 | Ugolnikov | 324/158 T |
| 4,058,776 | 11/1977 | Allen | 330/296 |
| 4,246,535 | 1/1981 | Huang | 330/2 |
| 4,317,083 | 2/1982 | Boyd | 330/296 |
| 4,481,464 | 11/1984 | Noguchi | 324/607 |
| 4,556,841 | 12/1985 | Carlson | 330/2 |
| 4,644,293 | 2/1987 | Kennett | 330/296 |
| 5,006,812 | 4/1991 | Erickson | 330/2 |
| 5,027,064 | 6/1991 | Cripps | 324/158 D |
| 5,049,816 | 9/1991 | Moslehi | 324/158 T |

*Primary Examiner*—Kenneth A. Wieder
*Assistant Examiner*—Jose M. Solis
*Attorney, Agent, or Firm*—Arthur L. Plevy; Patrick M. Hogan

[57] ABSTRACT

A test system for measuring the characteristics of an active circuit employs a pulsed bias technique for periodically biasing the input control port of the active circuit into the active region of operation. Biasing is achieved with a bias voltage that is periodically pulsed ON and OFF. An RF source is pulse modulated ON and OFF synchronously with the pulsed bias voltage and applied to the input control port of the active circuit. The pulsed RF occupies a portion of the time interval encompassed by the pulsed bias voltage. These voltages are combined and applied to the input port of the active circuit which operates only during the presence of the pulsed bias voltage and which is OFF during the absence of the pulsed bias voltage. A DC supply is utilized to bias the output port. The amplified RF power is then measured at the output port of the circuit, after the RF power has been separated from the DC bias by a non-reciprocal device.

5 Claims, 3 Drawing Sheets

METHOD AND APPARATUS FOR TESTING CIRCUITS CONTAINING ACTIVE DEVICES

This is a divisional application under 37 C.F.R. 1.62 of prior Ser. No. 08/013,248, filed, on Feb. 3, 1993, abandoned, which is a continuation of prior Ser. No. 07/763,365, filed Sep. 20, 1991, entitled METHOD AND APPARATUS FOR TESTING CIRCUITS CONTAINING ACTIVE DEVICES, abandoned.

FIELD OF THE INVENTION

This invention relates to the testing of electronic circuits containing active devices in general, and more particularly to a biasing technique for exciting the active elements of the circuit during the test.

BACKGROUND OF THE INVENTION

Many electronic circuits contain active elements such as bipolar transistors or unipolar Field Effect Transistors (FETs). These electronic circuits may contain one active element or several elements configured in various arrangements to provide specific functions, such as an RF power amplifier, power switch, etc. Generally, the class of microwave amplifiers employing bipolar and field effect transistors are referred to as two-port devices. Such devices act as valves. They control a large amount of power being delivered to an output load by a DC power supply with a small input signal. The input and output ports present a positive resistance to the circuit.

To serve their designed function, these active devices must be properly biased. Biasing is achieved usually from a single DC supply of a given polarity depending upon whether the device is an n or p type device. However, more than one DC supply can be used as well. In any event, the input port of the device, as well as the output port, must be separately biased at different voltage levels. Thus one biases the input port of the device, such as the base electrode of a transistor or the gate electrode of an FET and the output port, such as the collector or emitter electrode of a transistor or the drain or source electrode of an FET.

Many conventional test systems are known which are used to test and characterize active devices. These test systems provide DC biasing techniques which activate the device under test. Biasing voltages are applied from DC supplies, essentially in a continuous wave or CW mode. The biases are continuously and quiescently applied during the entire test. Moreover, the RF signal source used as the test signal at the input port of the device under test has also been applied in a CW or quiescent mode.

A disadvantage of these test systems has been that careful attention had to be given not to exceed the power limitations of the device under test. Since the DC bias and the RF signal were applied in a CW manner, power dissipation was also critical. The device under test had to be mounted on a good heat sink medium to ensure that the heat created was dissipated away from the device. Devices producing relatively high levels of RF power or requiring high levels of DC bias power, which were mounted on a medium having poor heat conductivity, could not be tested. This was especially true with hybrid devices that were still mounted on a wafer.

In order to reduce heat dissipation, other conventional systems are known which apply an RF signal in a pulse modulated manner. One such system is the Hewlett Packard 85110A pulsed S-parameter test set, which measures the scattering parameters of an active device by use of a pulse modulated RF signal. There is no capability, however, for controlling the DC power dissipation of the active device under test.

It is, however, the object of the present invention to overcome the disadvantages and limitations of prior active circuit test systems by providing a new and improved test system.

Another object of the present invention is to provide an active circuit test system which allows control of power dissipation while providing accurate RF and bias data for the circuit under test.

SUMMARY OF THE INVENTION

A test system for measuring the characteristics of an active circuit having an input control port for receiving an input signal and an output port for providing an output signal, comprising pulsed bias means for periodically biasing said input control port of said active circuit with a pulsed bias voltage, RF generating means coupled to said pulsed bias means for responsively generating pulsed RF synchronously with said pulsed bias voltage, wherein said pulsed RF occupies at least a portion of the same time interval occupied by said pulsed bias voltage, and combining means for delivering said pulsed RF and said pulse bias to the input control port of said circuit to enable said active circuit to conduct current only during the presence of said pulsed bias voltage.

DETAILED DESCRIPTION OF THE FIGURES

Figure 1:
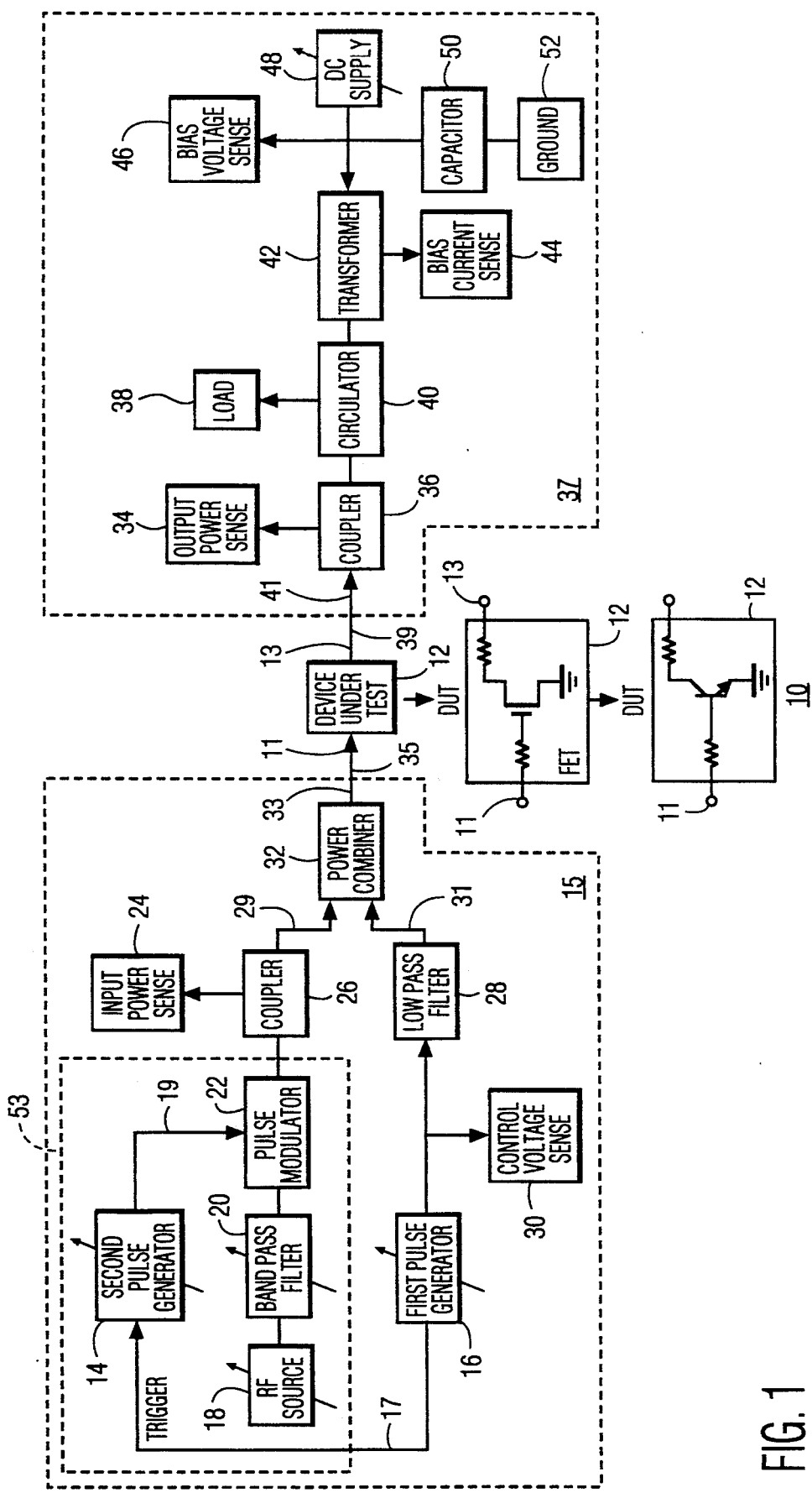
FIG. 1 is a block diagram of a system for testing active circuits according to this invention.

Referring to FIG. 1, there is shown a block diagram of the system 10 for testing active circuits according to this invention.

The test system 10 includes a device under test 12, hereinafter referred to as DUT 12. It will be understood that DUT 12 could be any active circuit device having active elements such as bipolar transistors, FETs, and so on. A representation of an FET and a bipolar transistor is shown in FIG. 1 as examples of such devices. The test system 10 according to this invention enables DUT 12 to be safely tested without producing excessive heat. This is accomplished by test system 10 controlling the DC and RF average power dissipation of DUT 12.

By way of example, assume that DUT 12 is a microwave integrated circuit, power amplifier and it is desired to determine its RF power gain. Typically, DUT 12 has an input control port 11 and an output port 13, as shown in FIG. 1. As will be explained in detail, input control port 11 and output port 13 must both be simultaneously biased, in order to permit passage of RF energy through DUT 12. For example, if DUT 12 is a FET amplifier, then the gate electrode operates as an input port 11, to enable amplification at the source or drain electrodes either of which can function as an output port 13. In order to enable a signal applied to the gate electrode or input port 11 to appear at the output port 13, the amplifier must be biased to operate properly.

Test system 10 includes an input section 15 and an output section 37. Input section 15 provides the DC bias and the RF energy to DUT 12 by way of input control port 11. Output section 37 receives the amplified RF energy from DUT 12 via output port 13 and further provides a DC bias for the output port of the DUT 12. The input section 15 measures input RF power and input bias levels while supplying the input bias. The output section 37 provides the output bias for DUT 12 and measures output RF and output bias levels. The input section 15 includes an RF generating means 53 comprised of an RF source 18, a bandpass filter 20, a pulse modulator 22 and a second pulse generator 14. The RF source 18 which can be a conventional RF oscillator or any other well known sinusoidal or pulse source. The oscillator 18 can be variable in both amplitude and frequency to enable multiple tests to be performed at different frequencies and levels. The output of the RF source 18 is coupled to an input of the band pass filter 20. The function of the band pass filter 20 is to limit the band of frequencies emanating from the RF source 18. The output of the band pass filter 20 is applied to a first input of the pulse modulator 22. The pulse modulator 22 receives a second input via lead 19 obtained from the second pulse generator 14. The output of the pulse modulator is coupled to one input of a typical coupling device 26 which has a second output coupled to an input power sensing circuit 24. The power sensing circuit 24 operates to measure the power at the coupler 26. The coupler 26 has an output applied to one input of a power combiner 32 via lead 29. A pulsed bias means such as first pulse generator 16 is shown having an output coupled to the input of a low pass filter 28. The output of the low pass filter via line 31 is coupled to the other input of power combiner 32. Essentially, the power combiner 32 operates to combine the pulse modulated RF signal from coupler 26 with the bias pulse from low pass filter 28. The power combiner 32 has its output 33 coupled through a suitable coupling device such as a coaxial cable to the input port 11 of the DUT 12. The output port 13 of the DUT 12 is coupled via a cable 39 or other means to the input of a coupler 36 located in output section 37. The coupler 36 has a terminal which is coupled to an output power sensing device or circuit 34 which circuit measures output power. The coupler 36 has another output coupled to one input of a three port circulator 40. The circulator 40 may be a ferrite circulator and has one port coupled to a load 38 which is a terminating resistor. As is known, by terminating the appropriate port of the circulator 36 with the load resistor 38, the circulator operates as an isolator. In this manner, RF generated by the DUT 12 at output port 13 is shunted by the isolator circulator 40 to the load resistor 38. The circulator has another port coupled to a current transformer 42. Essentially, the current transformer 42 has a primary winding through which DC current from a DC supply 48 flows. The transformer 42 has a few turns constituting a secondary winding which turns are coupled to a bias current sense circuit 44. The DC supply 48 has its output voltage monitored by a bias voltage sense circuit 46 which may be an ordinary oscilloscope, a volt meter, or some other device. The DC supply 48 is also coupled to a capacitor 50 which has one terminal returned to ground or a point of reference potential 52. The capacitor 50 essentially acts to resonate out any inductance which may be present at the output of the DC supply to therefore maintain a relatively constant voltage output for the DC supply. The output of the DC supply 48, as seen, is directed through the primary winding of the current transformer 42 where the DC is coupled through the circulator 40 and through the coupler 36 to the output port 13 which may, for example, be the drain or source electrode of a field effect transistor as DUT 12. In this manner, when the input port 11 receives the combined bias pulse and the pulse modulated RF signal, the output port produces a corresponding amplified pulse. At this time, the output of the FET will draw a requisite amount of current based on the input signal and hence an amplified output pulse will be generated. The magnitude of the output pulse is measured by the output power sensing circuit 34 which again may be an oscilloscope, a power meter, or some other conventional device.

As indicated, the input section 15 includes two pulse generators, a first pulse generator 16 and a second generator 14. Both can be variable in amplitude, pulse width, pulse rate or frequency, and so on. The first pulse generator 16 provides a bias pulse for the input of the DUT 12 to bias the DUT device "ON" only during the first pulse period. Thus the "ON" and "OFF" time of the DUT 12 is controlled by the first pulse to thereby control the DC power dissipation. The pulse amplitude generated by first pulse generator 16 can be made variable and is measured by control voltage sense circuit 30.

The pulse amplitude is adjusted to the value of the voltage necessary to bias DUT 12 into a desired operating region.

Figure 2:
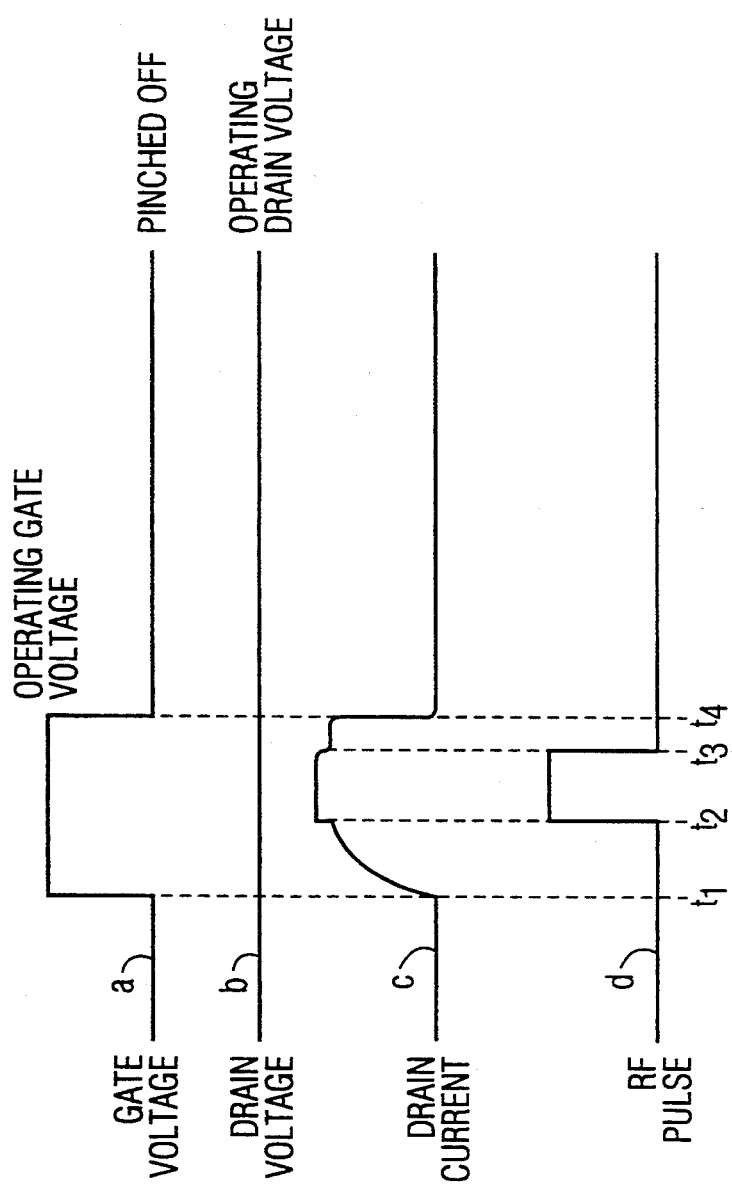
FIG. 2 shows a series of timing diagrams depicting typical signals generated according to the present invention.

For example, if DUT 12 is an FET device, then the voltage at input control port 11 is known as the gate voltage, or $V_{gs}$, and is depicted as waveform (a) in FIG. 2. The positive gate voltage from first pulse generator 16 biases the FET into the operating region for its positive duration. The polarity of the pulse (positive or negative) is selected as a function of the device, DUT 12, to be tested as an n or p device. During this time, the FET is ON and is dissipating power. However, during most of the time the voltage is set to the pinch-off level (OFF), thereby cutting off the FET. During this latter time, the FET is not dissipating any power. In this manner, first pulse generator 16 is effective in providing a pulsed bias to the input control port of DUT 12 to determine the "ON" and "OFF" time.

As indicated, the first pulse generator 16 also triggers the second pulse generator 14 by way of cable 17. More specifically, the leading edge of the pulsed bias waveform provided by first pulse generator 16 also triggers the second pulse generator 14. For reasons that will be explained later, it is desirable that first pulse generator 16 and second pulse generator 14 have pulse width adjustment capabilities. Pulse generators are well known and may include RC generators, coaxial line generators as well as a host of other devices as monostable multis, and so on, which are triggerable as well as free running devices for generator 16.

After a small delay, second pulse generator 14 provides a pulse to the input of pulse modulator 22 by way of cable 19. The pulse modulator 22, in turn, pulse modulates the RF signal generated by RF source 18 during the presence of the output pulse from generator 14.

It will be understood that RF source 18 generates a CW signal at microwave or RF frequencies. It is desirable that RF source 18 is a variable frequency source and at adjustable power levels. In this manner, DUT 12 can be operated at various RF frequencies and various RF input power levels. The RF power level can be adjusted by monitoring the received pulse modulated RF energy by input power sense 24 by way of coupler 26. Coupler 26 is effective in passing most of the pulsed RF energy to DUT 12, but diverting only a small portion of energy for sampling by input power sense 24. Power sense device can be a power meter, an oscilloscope or other device.

The band pass filter 20 is connected between RF source 18 and pulse modulator 22 and serves to attenuate RF frequencies outside the desired RF frequency band to be delivered to DUT 12. Since it is desirable to characterize DUT 12 at several RF frequencies, it is preferable that band pass filter 20 be relatively narrow and tuneable over a given frequency range. If a narrow RF frequency can be generated by RF source 18, then band pass filter 20 can be deleted from test system 10, or it can provide a means for identifying the RF frequency output of RF source 18.

Similarly, low pass filter 28 is connected to the output of first pulse generator 16 and serves to attenuate any voltage transients, fluctuations, spikes or overshoots that may otherwise be present in the pulsed DC bias, while mainly preventing RF power from coupler 29 to feed back to the output of pulse generator 30. In this manner, a pulsed, bias signal is made available for biasing DUT 12 ON and OFF at the desirable repetition interval.

Both the pulsed bias signal and the RF pulsed signal are combined by power combiner 32 by way of lines 31 and 29, respectively. Power combiner 32 is a conventional device which accepts two input signals and sums them at its output port 33. Power combiner 32 has the advantage of providing isolation between the two input signals. It will be understood that power combiner 32 may be a hybrid device or may be composed of discrete components. Power combiner 32 must, of course, have an adequate frequency response so that it can efficiently combine the selected RF frequency from RF source 18 and the selected pulsed bias frequency from first pulse generator 16.

Finally, output port 33 of the combiner 32 is connected to the input control port 11 of DUT 12 by way of connection 35. Connection 35 may be a standard wafer probe or a fixture insertion system suitable for the test set-up or a lead, and so on.

Now that the generation and combination of the pulsed DC bias signal and the pulsed RF signal have been described, a better understanding of their timing relationship may be obtained by referring to FIG. 2. The RF signal shown by waveform (d) is pulsed ON at time t2 and pulsed OFF at time t3. This is the output pulse of generator 14. It is important that the time interval, t2–t3, be properly located within the active pulsed bias interval of t1–t4. The delay between t2 and t1 will depend on the turn-on response time of DUT 12; similarly, the delay between t3 and t4 will depend on the turn-off response time of DUT 12.

In the example illustrated by FIG. 2, DUT 12 is an FET device which is characterized by a relatively slow turn-on response time, but a fast turn-off response. This may be seen by examining waveform (c) depicting the drain current, Id, flowing at the output port of the device. Note that the device is not fully turned ON until time t2. The FET begins to turn on during the gate voltage waveform which is the pulse from first pulse generator 16. This pulse also triggers pulse generator 14, which produces the pulse of FIG. 2(d) at time t2. At that time the drain current is increased somewhat by the presence of the pulsed RF at the gate input. The drain current drops down slightly to its quiescent level at time t3, due to the absence of the RF. The drain current drops completely to its OFF state at time t4, which is the termination time of the first generator pulse 2(a). It will be understood that the time interval between t3 and t4 may be shortened even further until it equals the turn-off response time of DUT 12. In this manner even less DC bias power will be dissipated by DUT 12.

Output section 37 will now be described. DC supply 48 is utilized to apply a DC bias to output port 13 of DUT 12. Transformer 42, circulator 40 and coupler 36 are inserted between DC supply 48 and the output port 13 of DUT 12. It will be understood that DC supply 48 is necessary to deliver a DC voltage at the output port 13. This DC voltage is the drain voltage shown in FIG. 2(b) and is at a given selectable DC voltage when the DUT 12 is in the "OFF" state. However, when the bias pulse of FIG. 2(a) is applied to the input port, the active DUT device draws current (FIG. 2(c)) and hence the voltage at the output port 13 decreases.

Thus as illustrated in FIG. 2, waveform (d) depicts the operating drain voltage, Vds. Although waveform (b) is shown to be a constant operating drain voltage, there is nothing to preclude it from being a pulsed bias voltage. In another embodiment of this invention, DC supply 48 could be replaced by an arrangement similar to that described for obtaining the pulsed gate voltage depicted by waveform (a). More specifically, the arrangement shown in FIG. 1 of three components (first pulse generator 16, low pass filter 28 and control voltage sense 30 providing the pulsed DC bias) could be utilized in lieu of DC supply 48. Under such circumstances, the pulse width of the drain voltage must be sufficiently wide to encompass the operating gate voltage depicted by waveform (a).

Referring to the preferred embodiment of FIG. 1, there is shown bias voltage sense 46 and bias current sense 44. Bias voltage sense 46 is placed in parallel or across DC supply 48 in order to precisely measure the DC bias voltage output. The current sense circuit 44 measures a DC bias current proportional to the current flowing through output port 13 of DUT 12. Transformer 42 is a current transformer and allows current to flow therethrough and through the circulator 40 and coupler 36 to the output port 13. The transformer has a few secondary windings coupled to the bias current sense circuit 44 for enabling the circuit to measure the output bias current. Capacitor 50 is also effective in suppressing any high frequency spikes, fluctuations or noise that may be introduced by either DC supply 48 or output port 13. The latter may have some high frequency spikes and noise due to the pulsed DC bias switching occurring at input port 11 of DUT 12. Compacitor 50 is selected to compensate for the inductance of the DC supply.

In order to measure the power output of DUT 12, coupler 36 and output power sense 34 are inserted in the manner shown in FIG. 1. Coupler 36 and output power sense 34 may be similar in design to that of coupler 26 and input power sense 24. Since coupler 26 is positioned between circulator 40 and DUT 12, output power sense 34 is effective in measuring the RF and DC power output of DUT 12.

Finally, side 41 of coupler 36 may be connected to output port 13 of DUT 12 by way of connection 39.

Connection 39 may be similar to connection 35 in its design as a wafer probe or fixture insertion device.

It is desirable that test system 10 be capable of characterizing DUT 12 in its linear and nonlinear regions. It is thus preferred that DUT 12 be driven to its full range of interest. This can be achieved if DC supply 48 and first pulse generator 16 have a wide dynamic range in supplying DC bias to DUT 12. Thus, once DUT 12 is placed under test, all parametric adjustments and measurements can be achieved without changing any components comprising test system 10.

Figure 3:
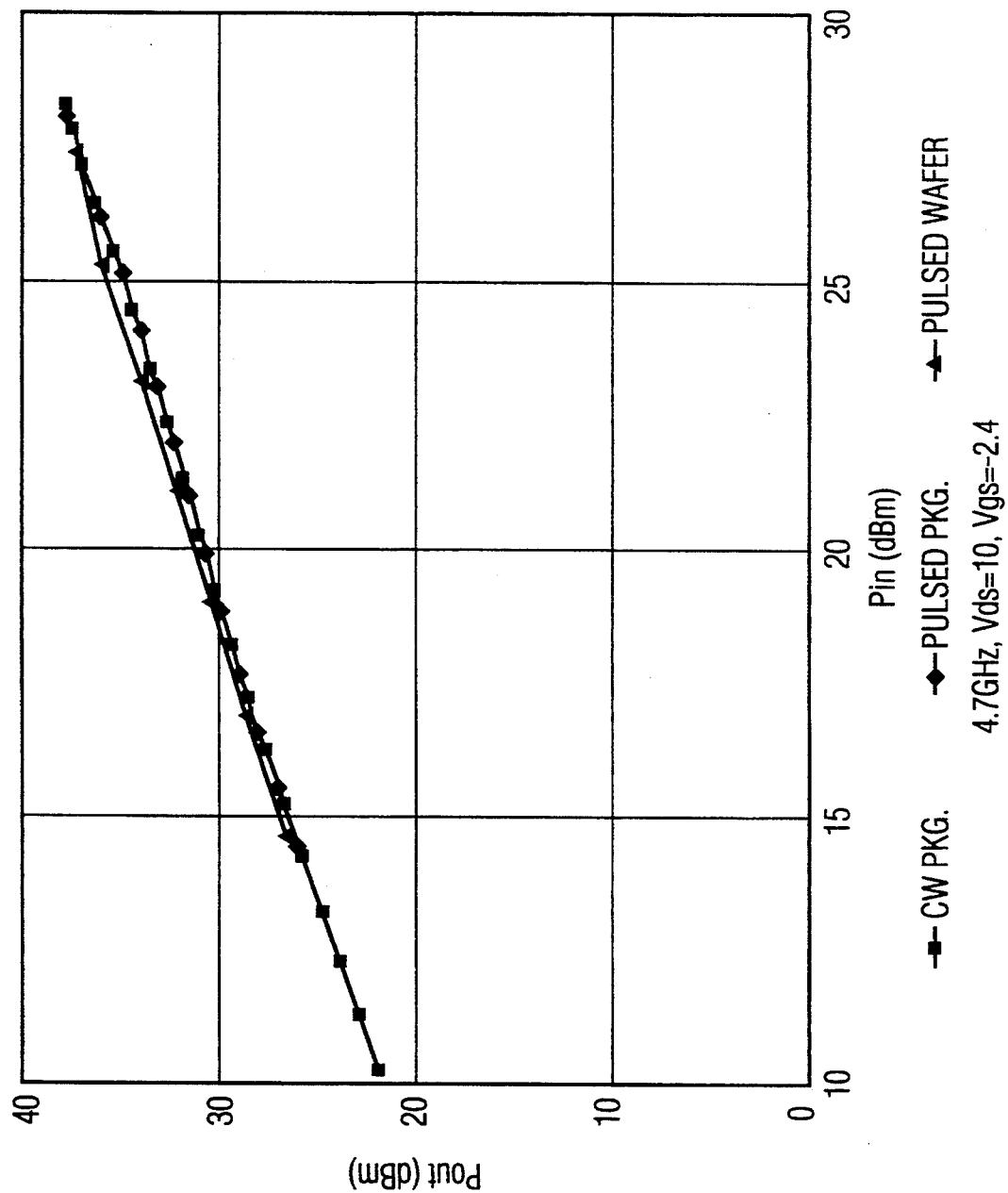
FIG. 3 is a graph depicting output power versus input power for active circuits measured according to the present invention.

The utility of this invention may be seen by examining FIG. 3. Shown therein are three data curves of input power versus output power of an FET amplifier. The input signals are a pulsed RF signal at 4.7 GHz and a DC bias signal held at Vgs of $-2.4$ volts. The output bias is at Vds of 10 volts.

The first data curve is that of the FET amplifier's input gate biased in a CW manner. The second data curve has the gate biased in a pulsed manner in accordance with this invention. The third data curve has the gate also biased in a pulsed manner, but the measurements were taken with the device still part of a wafer. As can be seen, all three approaches provide the same characterization of the FET.

We claim:

1. A test apparatus for testing an active circuit, said active circuit including at least one transistor having an input control port and an output port, comprising:

a first pulse generator means for providing a first periodic pulsed DC bias voltage at a given pulse repetition frequency (PRF) and with a first predetermined pulsewidth duration;

a second pulse generator means coupled to said first pulse generator means for generating a second periodic pulse train having pulses of a second predetermined pulsewidth duration less than said first pulsewidth duration and occurring at said given PRF, said first generator providing trigger pulses, at said given PRF and synchronized with said first pulsed DC bias voltage, to said second pulse generator to synchronize said second pulse train with respect to said first periodic pulsed DC bias voltage;

RF generating means for generating a given range of RF signals;

pulse modulator means, coupled to said RF generating means and to said second pulse generator means, for modulating said RF signals according to said second pulse train, thereby providing modulated RF pulses; and combining means, coupled to said pulse modulator means, said first pulse generator means and said input control port, for combining said modulated RF signals and said periodic pulsed DC bias voltage and providing said RF pulses synchronous with said pulsed DC bias voltage to said input control port whereby said pulsed DC bias operates to drive said input control port into an operating region during said first pulsewidth duration, said RF pulse being periodically provided during said first pulsewidth duration of said pulsed DC bias voltage.

2. The test apparatus according to claim 1, wherein said first pulse generator has voltage amplitude adjusting means for controlling the pulsed bias voltage at said input control port, pulse width adjusting means for controlling the pulsewidth duration of said bias voltage, and pulse repetition frequency adjusting means for controlling the pulsed frequency of said DC bias voltage.

3. The test apparatus according to claim 1, wherein said second pulse generator means includes time adjusting means for delaying said second pulse train with respect to said trigger pulses thereby delaying said RF pulses with respect to said pulsed DC bias.

4. The active circuit according to claim 1, wherein said active circuit includes a field effect transistor having a gate electrode input port and a drain electrode output port.

5. The active circuit according to claim 1, wherein said active input includes a bipolar transistor having a base electrode input port and a collector electrode output port.

* * * * *